(12) United States Patent
Yuan et al.

(10) Patent No.: US 10,566,071 B2
(45) Date of Patent: Feb. 18, 2020

(54) SHIFT REGISTER UNIT, METHOD FOR DRIVING SHIFT REGISTER UNIT, GATE DRIVING CIRCUIT AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Zhidong Yuan, Beijing (CN); Can Yuan, Beijing (CN); Zhenfei Cai, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 25 days.

(21) Appl. No.: 15/971,039

(22) Filed: May 4, 2018

(65) Prior Publication Data

US 2019/0103166 A1    Apr. 4, 2019

(30) Foreign Application Priority Data

Sep. 30, 2017   (CN) .......................... 2017 1 0918198

(51) Int. Cl.
*G09G 3/36*     (2006.01)
*G11C 19/28*    (2006.01)
(Continued)

(52) U.S. Cl.
CPC ............... *G11C 19/28* (2013.01); *G09G 3/20* (2013.01); *G09G 3/3266* (2013.01);
(Continued)

(58) Field of Classification Search
CPC ...... G09G 3/20; G09G 3/3266; G09G 3/3674; G09G 3/3677; G09G 2300/0408;
(Continued)

(56) References Cited

U.S. PATENT DOCUMENTS 9,378,696 B2 *  6/2016  Yao .......................... G09G 3/20
9,514,683 B2 * 12/2016  Cao ...................... G09G 3/3266
(Continued)

*Primary Examiner* — Patrick O Neill
(74) *Attorney, Agent, or Firm* — Brooks Kushman P.C.

(57) ABSTRACT

A shift register unit, a driving method thereof, a gate driving circuit and a display device are provided. The shift register unit includes: an input circuit configured to control a voltage applied to a first pull-up node; a timing controller circuit coupled to the first pull-up node and a second pull-up node, and configured to control a voltage applied to the second pull-up node based on the voltage applied to the first pull-up node; a first output circuit configured to control a voltage applied to a first output end; a second output circuit configured to control a voltage applied to a second output end; a pull-down control circuit configured to control a voltage applied to a pull-down node; a first pull-down circuit configured to control the voltage applied to the first pull-up node; and a second pull-down circuit configured to control the voltage applied to the second pull-up node.

20 Claims, 11 Drawing Sheets

(51) Int. Cl.
  *G11C 19/18*    (2006.01)
  *G09G 3/20*     (2006.01)
  *G09G 3/3266*   (2016.01)

(52) U.S. Cl.
  CPC ......... *G09G 3/3677* (2013.01); *G11C 19/184* (2013.01); *G09G 2300/0408* (2013.01); *G09G 2310/0286* (2013.01); *G09G 2310/08* (2013.01)

(58) Field of Classification Search
  CPC ....... G09G 2310/0286; G09G 2310/08; G11C 19/184; G11C 19/28
  See application file for complete search history.

(56) References Cited

U.S. PATENT DOCUMENTS

| | | | |
|---|---|---|---|
| 9,536,476 B2* | 1/2017 | Cao | G09G 3/3266 |
| 9,620,061 B2* | 4/2017 | Cao | G09G 3/3258 |
| 9,984,642 B2* | 5/2018 | Lv et al. | |
| 10,332,470 B2* | 6/2019 | Feng et al. | |
| 2019/0080780 A1* | 3/2019 | Wang et al. | |

\* cited by examiner

SHIFT REGISTER UNIT, METHOD FOR DRIVING SHIFT REGISTER UNIT, GATE DRIVING CIRCUIT AND DISPLAY DEVICE

CROSS-REFERENCE TO RELATED APPLICATION

This application claims priority to Chinese Patent Application No. 201710918198.5 filed on Sep. 30, 2017, which is incorporated herein by reference in its entirety.

TECHNICAL FIELD

The present disclosure relates to the field of display technology, in particular to a shift register unit, a method for driving the shift register unit, a gate driving circuit and a display device.

BACKGROUND

In order to achieve a narrow bezel of a display panel, a gate driving circuit formed on the display panel using a Gate On Array (GOA) technique. The gate driving circuit is directly integrated onto an array substrate, instead of arranging an independent gate driving chip.

The gate driving circuit includes a plurality of levels of shift register units (GOA units). Usually, the GOA unit at each level is configured to output a gate driving signal to pixel units at a corresponding level. Hence, the gate driving circuit is of a complex structure, and it may occupy a relatively large space.

In order to further optimize the space of the bezel, it is very important to provide a GOA unit capable of outputting the gate driving signal to multiple levels of pixel units.

SUMMARY

An object of the present disclosure is to provide a shift register unit, a method for driving the shift register unit, a gate driving circuit and a display device, so as to solve the above-mentioned problem.

In one aspect, the present disclosure provides in some embodiments a shift register unit, including an input circuit, a timing controller circuit, a first output circuit, a second output circuit, a pull-down control circuit, a first pull-down circuit and a second pull-down circuit. The input circuit is coupled to a first pull-up node, and configured to control a voltage applied to the first pull-up node based on a voltage applied to an input end. The timing controller circuit is coupled to the first pull-up node and a second pull-up node, and configured to control a voltage applied to the second pull-up node based on the voltage applied to the first pull-up node. The first output circuit is coupled to the first pull-up node, and configured to control a voltage applied to a first output end based on the voltage applied to the first pull-up node. The second output circuit is coupled to the second pull-up node, and configured to control a voltage applied to a second output end based on the voltage applied to the second pull-up node. The pull-down control circuit is coupled to the first pull-down circuit and the second pull-down circuit via a pull-down node, and configured to control a voltage applied to the pull-down node based on the voltage applied to the input end. The first pull-down circuit is coupled to the first pull-up node, and configured to control the voltage applied to the first pull-up node based on the voltage applied to the pull-down node. The second pull-down circuit is coupled to the second pull-up node, and configured to control the voltage applied to the second pull-up node based on the voltage applied to the pull-down node.

In a possible embodiment of the present disclosure, the shift register unit further includes a third output circuit coupled to a third pull-up node which is coupled to one of the first pull-up node and the second pull-up node, and the third output circuit is configured to control a voltage applied to a third output end based on a voltage applied to the third pull-up node.

In a possible embodiment of the present disclosure, the timing controller circuit includes a first transistor, a control electrode of which is coupled to the first pull-up node, a first electrode of which is coupled to a timing control signal end, and a second electrode of which is coupled to the second pull-up node.

In a possible embodiment of the present disclosure, the first output circuit includes a second transistor and a first capacitor. A control electrode of the second transistor is coupled to the first pull-up node, a first electrode thereof is coupled to a first clock signal end, and a second electrode thereof is coupled to the first output end. The first capacitor is coupled to the control electrode and the second electrode of the second transistor. The second output circuit includes a third transistor and a second capacitor. A control electrode of the third transistor is coupled to the second pull-up node, a first electrode thereof is coupled to a second clock signal end, and a second electrode thereof is coupled to the second output end. The second capacitor is coupled to the control electrode and the second electrode of the third transistor.

In a possible embodiment of the present disclosure, the input circuit includes a fourth transistor, a control electrode of which is coupled to the input end, a first electrode of which is coupled to a first voltage end, and a second electrode of which is coupled to the first pull-up node.

In a possible embodiment of the present disclosure, the pull-down control circuit includes a fifth transistor, a sixth transistor, a seventh transistor and an eighth transistor. A control electrode and a first electrode of the fifth transistor are coupled to the first voltage end, and a second electrode thereof is coupled to a first electrode of the sixth transistor. A control electrode of the sixth transistor is coupled to the input end, the first electrode thereof is further coupled to a control electrode of the seventh transistor, and a second electrode thereof is coupled to a second voltage end. The control electrode of the seventh transistor is further coupled to the second electrode of the fifth transistor, a first electrode thereof is coupled to a pull-down control signal end, and a second electrode thereof is coupled to a first electrode of the eighth transistor. A control electrode of the eighth transistor is coupled to the input end, the first electrode thereof is further coupled to the pull-down node, and a second electrode thereof is coupled to the second voltage end.

In a possible embodiment of the present disclosure, the first pull-down circuit includes a ninth transistor, a control electrode of which is coupled to the pull-down node, a first electrode of which is coupled to the first pull-up node, and a second electrode of which is coupled to the second voltage end. The second pull-down circuit includes a tenth transistor, a control electrode of which is coupled to the pull-down node, a first electrode of which is coupled to the second pull-up node, and a second electrode of which is coupled to the second voltage end.

In a possible embodiment of the present disclosure, the first pull-down circuit further includes an eleventh transistor, a first electrode of which is coupled to the first output end, a second electrode of which is coupled to the second voltage end, and a control electrode of which is coupled to the second output end. The second pull-down circuit further includes a twelfth transistor, a first electrode of which is coupled to the second output end, a second electrode of which is coupled to the second voltage end, and a control electrode of which is coupled to the first output end.

In a possible embodiment of the present disclosure, the input circuit includes a thirteenth transistor, a fourteenth transistor, a fifteenth transistor, a sixteenth transistor, a seventeenth transistor and an eighteenth transistor. A control electrode and a first electrode of the thirteenth transistor are coupled to the input end, and a second electrode thereof is coupled to a first electrode of the fourteenth transistor. A control electrode of the fourteenth transistor is coupled to the input end, the first electrode thereof is further coupled to a control electrode of the fifteenth transistor, and a second electrode thereof is coupled to the first pull-up node. The control electrode and a second electrode of the fifteenth transistor are coupled to the second electrode of the thirteenth transistor, and a first electrode thereof is coupled to the first voltage end. A control electrode of the sixteenth transistor is coupled to the control electrode of the fifteenth transistor, a first electrode thereof is coupled to the first voltage end, and a second electrode thereof is coupled to the first pull-up node. A control electrode of the seventeenth transistor is coupled to the pull-down node, a first electrode thereof is coupled to the first pull-up node, and a second electrode thereof is coupled to the second electrode of the fifteenth transistor. A control electrode of the eighteenth transistor is coupled to the pull-down node, a first electrode thereof is coupled to the second electrode of the seventeenth transistor, and a second electrode thereof is coupled to the second voltage end.

In another aspect, the present disclosure provides in some embodiments a shift register unit, including a first transistor, a second transistor, a first capacitor, a third transistor, a second capacitor, a fourth transistor, a fifth transistor, a sixth transistor, a seventh transistor, an eighth transistor, a ninth transistor, a tenth transistor, an input end, a first output end and a second output end. A control electrode of the first transistor is coupled to a first pull-up node, a first electrode thereof is coupled to a timing control signal end, and a second electrode thereof is coupled to a second pull-up node. A control electrode of the second transistor is coupled to the first pull-up node, a first electrode thereof is coupled to a first clock signal end, and a second electrode thereof is coupled to the first output end. The first capacitor is coupled to the control electrode and the second electrode of the second transistor. A control electrode of the third transistor is coupled to the second pull-up node, a first electrode thereof is coupled to a second clock signal end, and a second electrode thereof is coupled to the second output end. The second capacitor is coupled to the control electrode and the second electrode of the third transistor. A control electrode of the fourth transistor is coupled to the input end, a first electrode thereof is coupled to a first voltage end, and a second electrode thereof is coupled to the first pull-up node. A control electrode and a first electrode of the fifth transistor are coupled to the first voltage end, and a second electrode thereof is coupled to a first electrode of the sixth transistor. A control electrode of the sixth transistor is coupled to the input end, the first electrode thereof is further coupled to a control electrode of the seventh transistor, and a second electrode thereof is coupled to a second voltage end. The control electrode of the seventh transistor is further coupled to the second electrode of the fifth transistor, a first electrode thereof is coupled to a pull-down control signal end, and a second electrode thereof is coupled to a first electrode of the eighth transistor. A control electrode of the eighth transistor is coupled to the input end, the first electrode thereof is further coupled to the pull-down node, and a second electrode thereof is coupled to the second voltage end. A control electrode of the ninth transistor is coupled to the pull-down node, a first electrode thereof is coupled to the first pull-up node, and a second electrode thereof is coupled to the second voltage end. A control electrode of the tenth transistor is coupled to the pull-down node, a first electrode thereof is coupled to the second pull-up node, and a second electrode thereof is coupled to the second voltage end.

In a possible embodiment of the present disclosure, the shift register unit further includes an eleventh transistor and a twelfth transistor. A first electrode of the eleventh transistor is coupled to the first output end, a second electrode thereof is coupled to the second voltage end, and a control electrode thereof is coupled to the second output end. A first electrode of the twelfth transistor is coupled to the second output end, a second electrode thereof is coupled to the second voltage end, and a control electrode thereof is coupled to the first output end.

In yet another aspect, the present disclosure provides in some embodiments a shift register unit, including a first transistor, a second transistor, a first capacitor, a third transistor, a second capacitor, a fifth transistor, a sixth transistor, a seventh transistor, an eighth transistor, a ninth transistor, a tenth transistor, a thirteenth transistor, a fourteenth transistor, a fifteenth transistor, a sixteenth transistor, a seventeenth transistor, an eighteenth transistor, an input end, a first output end and a second output end. A control electrode of the first transistor is coupled to a first pull-up node, a first electrode thereof is coupled to a timing control signal end, and a second electrode thereof is coupled to a second pull-up node. A control electrode of the second transistor is coupled to the first pull-up node, a first electrode thereof is coupled to a first clock signal end, and a second electrode thereof is coupled to the first output end. The first capacitor is coupled to the control electrode and the second electrode of the second transistor. A control electrode of the third transistor is coupled to the second pull-up node, a first electrode thereof is coupled to a second clock signal end, and a second electrode thereof is coupled to the second output end. The second capacitor is coupled to the control electrode and the second electrode of the third transistor. A control electrode and a first electrode of the fifth transistor are coupled to the first voltage end, and a second electrode thereof is coupled to a first electrode of the sixth transistor. A control electrode of the sixth transistor is coupled to the input end, the first electrode thereof is further coupled to a control electrode of the seventh transistor, and a second electrode thereof is coupled to a second voltage end. The control electrode of the seventh transistor is further coupled to the second electrode of the fifth transistor, a first electrode thereof is coupled to a pull-down control signal end, and a second electrode thereof is coupled to a first electrode of the eighth transistor. A control electrode of the eighth transistor is coupled to the input end, the first electrode thereof is further coupled to the pull-down node, and a second electrode thereof is coupled to the second voltage end. A control electrode of the ninth transistor is coupled to the pull-down node, a first electrode thereof is coupled to the first pull-up node, and a second electrode thereof is coupled to the second voltage end. A control electrode of the tenth transistor is coupled to the pull-down node, a first electrode thereof is coupled to the second pull-up node, and a second electrode thereof is coupled to the second voltage end. A control electrode and a first electrode of the thirteenth transistor are coupled to the input end, and a second electrode thereof is coupled to a first electrode of the fourteenth transistor. A control electrode of the fourteenth transistor is coupled to the input end, a first electrode thereof is coupled to a control electrode of the fifteenth transistor, and a second electrode thereof is coupled to the first pull-up node. The control electrode and a second electrode of the fifteenth transistor are coupled to the second electrode of the thirteenth transistor, and a first electrode thereof is coupled to the first voltage end. A control electrode of the sixteenth transistor is coupled to the control electrode of the fifteenth transistor, a first electrode thereof is coupled to the first voltage end, and a second electrode thereof is coupled to the first pull-up node. A control electrode of the seventeenth transistor is coupled to the pull-down node, a first electrode thereof is coupled to the first pull-up node, and a second electrode thereof is coupled to the second electrode of the fifteenth transistor. A control electrode of the eighteenth transistor is coupled to the pull-down node, a first electrode thereof is coupled to the second electrode of the seventeenth transistor, and a second electrode thereof is coupled to the second voltage end.

In still yet another aspect, the present disclosure provides in some embodiments a method for driving a shift register unit, including steps of: in response to a valid voltage applied to an input end, applying a valid voltage to a first pull-up node; in response to the valid voltage applied to the first pull-up node and a valid voltage applied to a first clock signal end, applying a valid voltage to a first output end; in response to the valid voltage applied to the first pull-up node and a valid voltage applied to a timing control signal end, applying a valid voltage to a second pull-up node; in response to the valid voltage applied to the second pull-up node and a valid voltage applied to a second clock signal end, applying a valid voltage to a second output end; in response to an invalid voltage applied to the input end and a valid voltage applied to a pull-down control signal end, applying a valid voltage to a pull-down node; and in response to the valid voltage applied to the pull-down node, applying an invalid voltage to the first pull-up node and the second pull-up node.

In still yet another aspect, the present disclosure provides in some embodiments a gate driving circuit including a plurality of shift register units connected to each other in a cascaded manner. Apart from a last-level shift register unit, one of output ends of a current-level shift register unit is coupled to an input end of a next-level shift register unit next to the current-level shift register unit.

In still yet another aspect, the present disclosure provides in some embodiments a display panel including the above-mentioned gate driving circuit.

In still yet another aspect, the present disclosure provides in some embodiments a display device including the above-mentioned display panel.

BRIEF DESCRIPTION OF THE DRAWINGS

The present disclosure will be described in a more apparent manner in conjunction with the following drawings. It should be appreciated that, the following drawings are merely used for some embodiments of the present disclosure, but shall not be construed as limiting the present disclosure. In these drawings.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
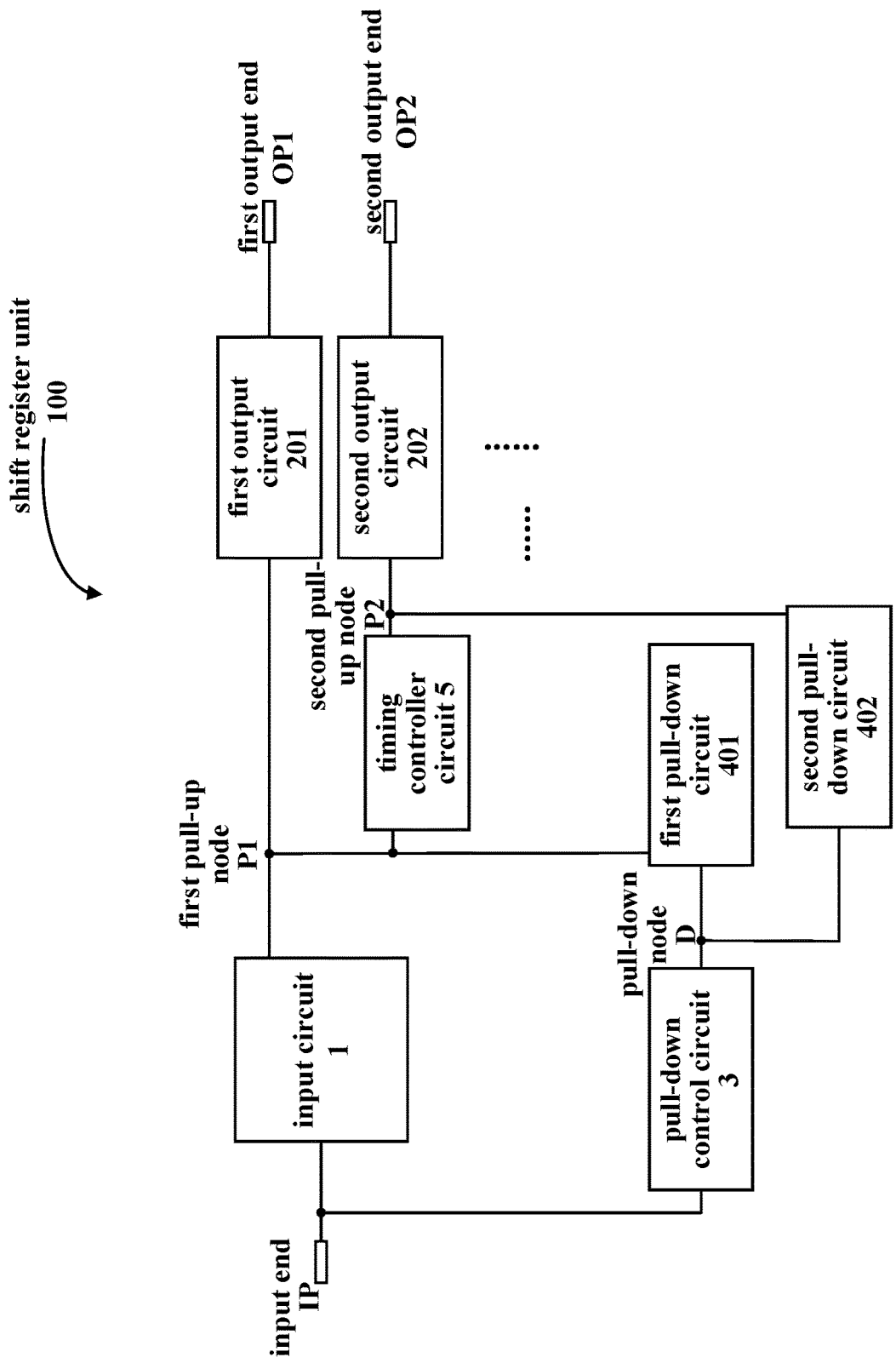
FIG. 1 is a block diagram of a shift register unit according to one embodiment of the present disclosure.

The present disclosure provides in some embodiments a shift register unit 100 which, as shown in FIG. 1, includes an input circuit 1, a timing controller circuit 5, a first output circuit 201, a second output circuit 202, a pull-down control circuit 3, a first pull-down circuit 401 and a second pull-down circuit 402. The input circuit 1 is coupled to a first pull-up node P1, and configured to control a voltage applied to the first pull-up node P1 based on a voltage applied to an input end IP. The timing controller circuit 5 is coupled to the first pull-up node P1 and a second pull-up node P2, and configured to control a voltage applied to the second pull-up node P2 based on the voltage applied to the first pull-up node P1. The first output circuit 201 is coupled to the first pull-up node P1, and configured to control a voltage applied to a first output end OP1 based on the voltage applied to the first pull-up node P1. The second output circuit 202 is coupled to the second pull-up node P2, and configured to control a voltage applied to a second output end OP2 based on the voltage applied to the second pull-up node P2. The pull-down control circuit 3 is coupled to the first pull-down circuit 401 and the second pull-down circuit 402 via a pull-down node D, and configured to control a voltage applied to the pull-down node D based on the voltage applied to the input end IP. The first pull-down circuit 401 is coupled to the first pull-up node P1, and configured to control the voltage applied to the first pull-up node P1 based on the voltage applied to the pull-down node D. The second pull-down circuit 402 is coupled to the second pull-up node P2, and configured to control the voltage applied to the second pull-up node P2 based on the voltage applied to the pull-down node D.

According to the shift register unit in the embodiments of the present disclosure, through the first output circuit 201 and the second output circuit 202, it is able to output gate driving signals of multiple levels through one level shift register unit. In addition, through the timing controller circuit 5 coupled to the first pull-up node P1 and the second pull-up node P2, it is able to adjust a timing-sequence relationship between the gate driving signals of multiple levels, thereby to meet different application requirements.

Figure 2:
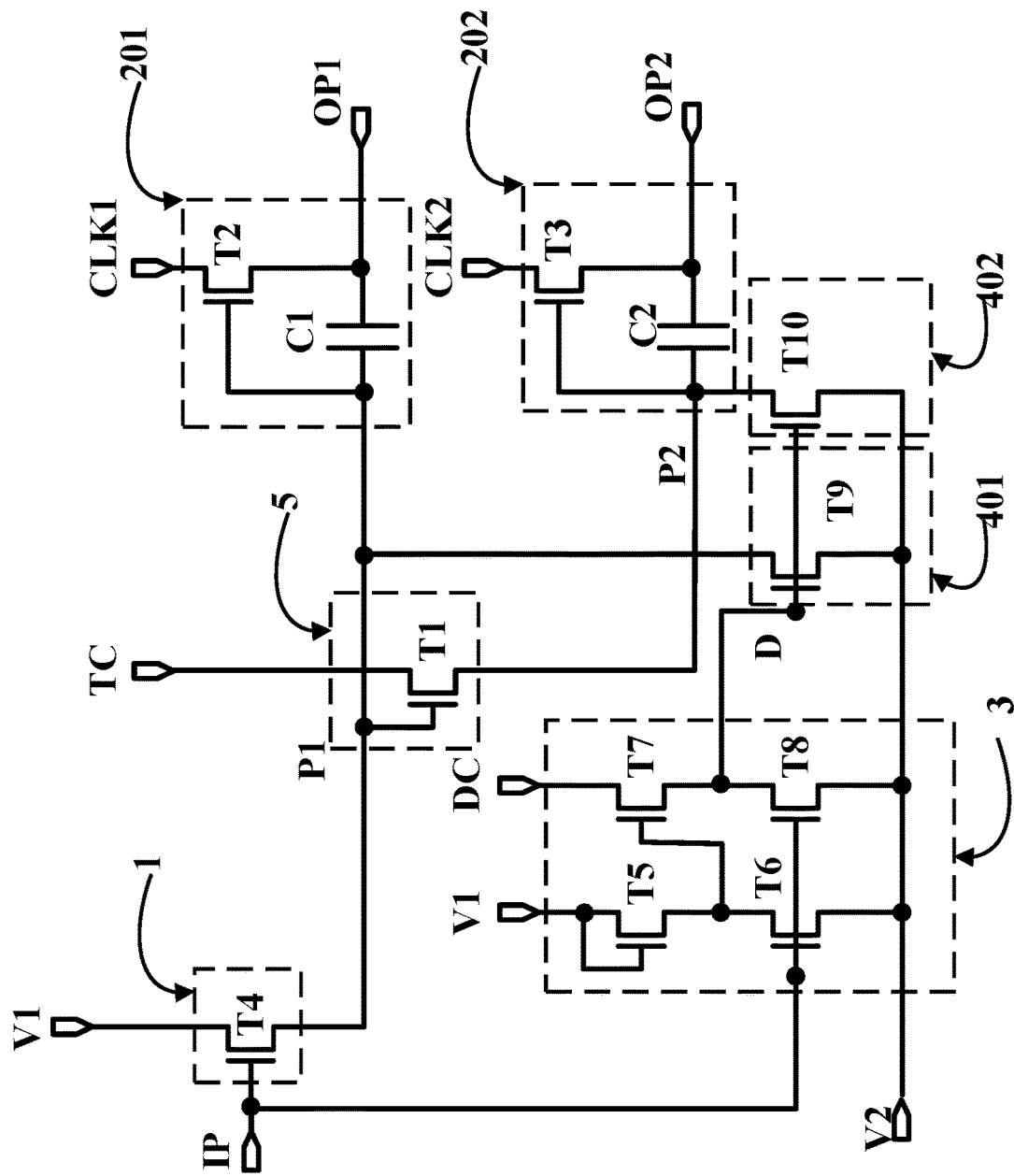
FIG. 2 is a circuit diagram of the shift register unit in FIG. 1.

As shown in FIG. 2 being an example of a circuit diagram of the shift register unit in FIG. 1, the timing controller circuit 5 includes a first transistor T1, a control electrode of the first transistor T1 is coupled to the first pull-up node P1, a first electrode of the first transistor T1 is coupled to a timing control signal end TC, and a second electrode of the first transistor T1 is coupled to the second pull-up node P2.

The timing controller circuit 5 may control the voltage applied to the second pull-up node P2 based on the voltage applied to the first pull-up node P1. To be specific, in the case that a valid voltage has been applied to the first pull-up node P1, the first transistor T1 may be turned on, so that the timing control signal end TC is electrically coupled to the second pull-up node P2. In this way, in the case that the valid voltage has been applied to the first pull-up node P1 to enable the first output circuit 201 to enter a desired operating state, the voltage applied to the second pull-up node P2 may not be necessarily valid immediately. The voltage applied to the second pull-up node P2 is valid merely in the case that the valid voltages have been applied to the first pull-up node P1 and the timing control signal end TC simultaneously. As a result, through flexibly adjusting the voltage applied to the timing control signal end TC, it is able to adjust a time point when the voltage applied to the second pull-up node P2 is turned to be valid, thereby to control a time point when the second output circuit 202 enters the desired operating state.

Through the circuit in FIG. 2, it is able to adjust the timing sequence relationship between the gate driving signals of multiple levels via a simple circuit structure, thereby to meet different application requirements. For example, the voltage applied to the timing control signal end TC may be adjusted in such a manner that the second output end OP2 may output the gate driving signal before the first output end OP1 outputs the gate driving signal, or the second output end OP2 and the first output end OP1 may output the respective gate driving signals simultaneously, or the second output end OP2 may output the gate driving signal after the first output end OP1 outputs the gate driving signal.

It should be appreciated that, the so-called valid voltage refers to a voltage being sufficient to enable a corresponding circuit or element to enter the desire operating state, and rather than a specific voltage amplitude. For example, the valid voltage applied to the first pull-up node P1 may refer to a voltage being sufficient to turn on the first transistor T1. In the case that the first transistor T1 is a P-type transistor, the valid voltage may be a voltage being sufficiently low to turn on the first transistor T1. In the case that the first transistor is an N-type transistor, the valid voltage may be a voltage sufficiently high to turn on the first transistor T1. Identically, the so-called invalid voltage may refer to a voltage insufficient to enable the corresponding circuit or element to enter the desired operating state. For example, the invalid voltage applied to the first pull-up node P1 may refer to a voltage being insufficient to turn on the first transistor T1 and keeping the first transistor T1 being cut off.

Generally speaking, the term "couple" may refer to "electrically couple", or "connect", or "electrically connect" in a direct or indirect manner.

In FIG. 2, the first output circuit 201 has a structure identical to the second output circuit 202. The first output circuit 201 includes a second transistor T2 and a first capacitor C1. A control electrode of the second transistor T2 is coupled to the first pull-up node P1, a first electrode of the second transistor T2 is coupled to a first clock signal end CLK1, and a second electrode of the second transistor T2 is coupled to the first output end OP1. The first capacitor C1 is coupled to the control electrode and the second electrode of the second transistor T2, i.e., to the first pull-up node P1 and the first output end OP1.

In the case that the voltage applied to the first pull-up node P1 is valid, the second transistor T2 may be turned on, so the first output end OP1 may be coupled to the first clock signal end CLK1. Then, in the case that the voltage applied to the first clock signal end CLK1 is valid, the first output end OP1 may output a valid gate driving signal. In addition, in the case that the voltage applied to the first output end OP1 is changed from being invalid to be valid, the voltage applied to the first pull-up node P1 may change too, because a voltage difference between two ends of the first capacitor C1 is maintained constant. For example, in the case that the valid voltage applied to the first pull-up node P1 is a high voltage, the voltage applied to the first pull-up node P1 may increase continuously, so as to enable the second transistor T2 to be in an on state in a more stable manner.

The second output circuit 202 includes a third transistor T3 and a second capacitor C2. A control electrode of the third transistor T3 is coupled to the second pull-up node P2, a first electrode of the third transistor T3 is coupled to a second clock signal end CLK2, and a second electrode of the third transistor T3 is coupled to the second output end OP2. The second capacitor C2 is coupled to the control electrode and the second electrode of the third transistor T3, i.e., to the second pull-up node P2 and the second output end OP2.

In the case that the voltage applied to the second pull-up node P2 is valid, the third transistor T3 may be turned on, so the second output end OP2 may be electrically coupled to the second clock signal end CLK2. Then, in the case that the voltage applied to the second clock signal end CLK2 is valid, the second output end OP2 may output a valid gate driving signal. In addition, in the case that the voltage applied to the second output end OP2 is changed from being invalid to be valid, the voltage applied to the second pull-up node P2 may change too, because a voltage difference between two ends of the second capacitor C2 is maintained constant. Similarly, for example, in the case that the valid voltage applied to the second pull-up node P2 is a high voltage, the voltage applied to the second pull-up node P2 may increase continuously, so as to enable the third transistor T3 to be in an on state in a more stable manner.

Through the first capacitor C1 and the second capacitor C2, it is able for the corresponding second transistor T2 and third capacitor T3 to be in the on state in a more stable manner. In addition, the output circuits may be of an identical structure, so it is very easy to provide more gate driving signals outputted from the shift register unit.

As shown in FIG. 2, the input circuit 1 includes a fourth transistor T4, a control electrode of the fourth transistor T4 is coupled to the input end IP, a first electrode of the fourth transistor T4 is coupled to a first voltage end V1, and a second electrode of the fourth transistor T4 is coupled to the first pull-up node P1. In the case that the voltage applied to the input end IP is valid, the first pull-up node P1 may be electrically coupled to the first voltage end V1. Hence, in the case that the voltages applied to the input end IP and the first voltage end V1 are valid simultaneously, the voltage applied to the first pull-up node P1 may be valid too. At this time, it is able for the first voltage end V1 to be coupled to a voltage source capable of applying the valid voltage all the time. In the case that the valid voltage is applied to the first pull-up node P1 through the voltage source, it is able to provide the voltage in a stable manner and reduce a resultant noise.

In a possible embodiment of the present disclosure, the first voltage end V1 may be coupled to the input end IP, i.e., the input end IP maybe coupled to both of the control electrode and the first electrode of the fourth transistor T4. At this time, the voltage applied to the first pull-up node P1 may be valid as long as the voltage applied to the input end IP is valid.

As shown in FIG. 2, the pull-down control circuit 3 includes a fifth transistor T5, a sixth transistor T6, a seventh transistor T7 and an eighth transistor T8. A control electrode and a first electrode of the fifth transistor T5 are coupled to the first voltage end V1, and a second electrode of the fifth transistor T5 is coupled to a first electrode of the sixth transistor T6. A control electrode of the sixth transistor T6 is coupled to the input end IP, the first electrode of the sixth transistor T6 is further coupled to a control electrode of the seventh transistor T7, and a second electrode of the sixth transistor T6 is coupled to a second voltage end V2. The control electrode of the seventh transistor T7 is further coupled to the second electrode of the fifth transistor T5, a first electrode of the seventh transistor T7 is coupled to a pull-down control signal end DC, and a second electrode of the seventh transistor T7 is coupled to a first electrode of the eighth transistor T8. A control electrode of the eighth transistor T8 is coupled to the input end IP, the first electrode of the eighth transistor T8 is further coupled to the pull-down node D, and a second electrode of the eighth transistor T8 is coupled to the second voltage end V2. The second voltage end V2 may be coupled to a voltage source capable of applying an invalid voltage all the time.

In the case that the voltage applied to the input end IP is invalid, the sixth transistor T6 and the eighth transistor T8 are cut off. Under the effect of the valid voltage applied to the first voltage end V1, the fifth transistor T5 is in the on state all the time. The voltage applied to the second electrode of the fifth transistor T5 is valid, so the seventh transistor T7 is turned on, and the pull-down node D is coupled to the pull-down control signal end DC. In the case that the voltage applied to the pull-down control signal end DC is valid, the first pull-down circuit 401 and the second pull-down circuit 402 may enter the desired operating state, i.e., the voltage applied to the second pull-up node P2 may be pulled down with respect to the first pull-up node P1. In the case that the voltage applied to the pull-down control signal end DC is invalid, the first pull-down circuit 401 and the second pull-down circuit 402 may not enter the desired operating state, i.e., the voltages applied to the first pull-up node P1 and the second pull-up node P2 may not be pulled down.

In the case that the voltage applied to the input end IP is valid, the sixth transistor T6 is turned on, so the control electrode of the seventh transistor T7 is coupled to the second voltage end V2. At this time, the seventh transistor T7 is cut off, and thereby the pull-down control signal end DC is decoupled from the pull-down node D. The eighth transistor T8 is turned on, so the pull-down node D is coupled to the second voltage end V2, and the voltage applied to the pull-down node D may be invalid all the time.

Through the above-mentioned control logic, in the case that the voltage applied to the input end IP is valid, it is able to prevent the voltage applied to the pull-down node D from being valid due to the existence the noise, thereby to prevent the output of the gate driving signal from being adversely affected to some extent.

In FIG. 2, the first pull-down circuit 401 and the second pull-down circuit 402 may also have an identical structure, corresponding to the output circuits having the identical structure. To be specific, the first pull-down circuit 401 includes a ninth transistor T9, a control electrode of the ninth transistor T9 is coupled to the pull-down node D, a first electrode of the ninth transistor T9 is coupled to the first pull-up node P1, and a second electrode of the ninth transistor T9 is coupled to the second voltage end V2. In the case that the voltage applied to the pull-down node D is valid, the ninth transistor T9 may be turned on, so the first pull-up node P1 may be coupled to the second voltage end V2. At this time, the voltage applied to the first pull-up node P1 is invalid, so the first output circuit 201 may not output the gate driving signal any more.

The second pull-down circuit 402 includes a tenth transistor T10, a control electrode of the tenth transistor T10 is coupled to the pull-down node D, a first electrode of the tenth transistor T10 is coupled to the second pull-up node P2, and a second electrode of the tenth transistor T10 is coupled to the second voltage end V2. In the case that the voltage applied to the pull-down node D is valid, the tenth transistor T10 may be turned on, so the second pull-up node P2 may be coupled to the second voltage end V2. At this time, the voltage applied to the second pull-up node P2 is invalid, so the second output circuit 202 may not output the gate driving signal any more.

The pull-down node D may be coupled to each of a plurality of pull-down circuits, so as to simplify the structure of the circuit.

The circuit in FIG. 2 has multiple advantages. For example, it is able to inhibit the noise in a stable and continuous manner. For example, the output circuits may be of an identical structure, and the pull-down circuits may be of an identical structure, so as to easily extend and replace the portions of the shift register unit, thereby to especially facilitate the maintenance of the circuit with damaged portions without adverse effects. Especially advantageously, it is able for the timing controller circuit 5 to flexibly adjust the timing sequence between the multiple outputs.

Figure 3:
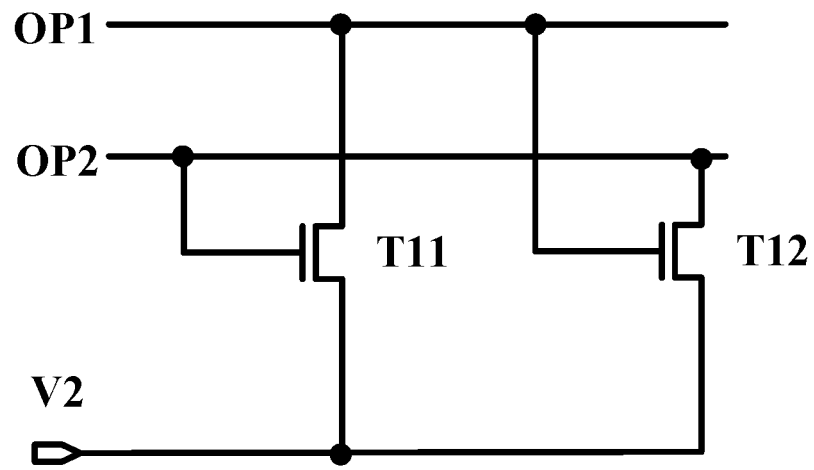
FIG. 3 is a schematic view showing an additional portion of the circuit in FIG. 2.

As shown in FIG. 3, which is a schematic view showing an additional portion of the circuit in FIG. 2, the first pull-down circuit 401 may further include an eleventh transistor T11, a first electrode of the eleventh transistor T11 is coupled to the first output end OP1, a second electrode of the eleventh transistor T11 is coupled to the second voltage end V2, and a control electrode of the eleventh transistor T11 is coupled to the second output end OP2. In other words, in the case that the voltage applied to the second output end OP2 is valid, the eleventh transistor T11 may be turned on, so the first output end OP1 may be coupled to the second voltage end V2.

The second pull-down circuit 402 may further include a twelfth transistor T12, a first electrode of the twelfth transistor T12 is coupled to the second output end OP2, a second electrode of the twelfth transistor T12 is coupled to the second voltage end V2, and a control electrode of the twelfth transistor T12 is coupled to the first output end OP1. In other words, in the case that the voltage applied to the first output end OP1 is valid, the twelfth transistor T12 may be turned on, so the second output end OP2 may be coupled to the second voltage end V2.

Through the above arrangement, it is able to prevent from outputting multiple valid gate driving signals, thereby to output the gate driving signals of multiple levels at a correct timing sequence and reduce the noise.

Figure 4:
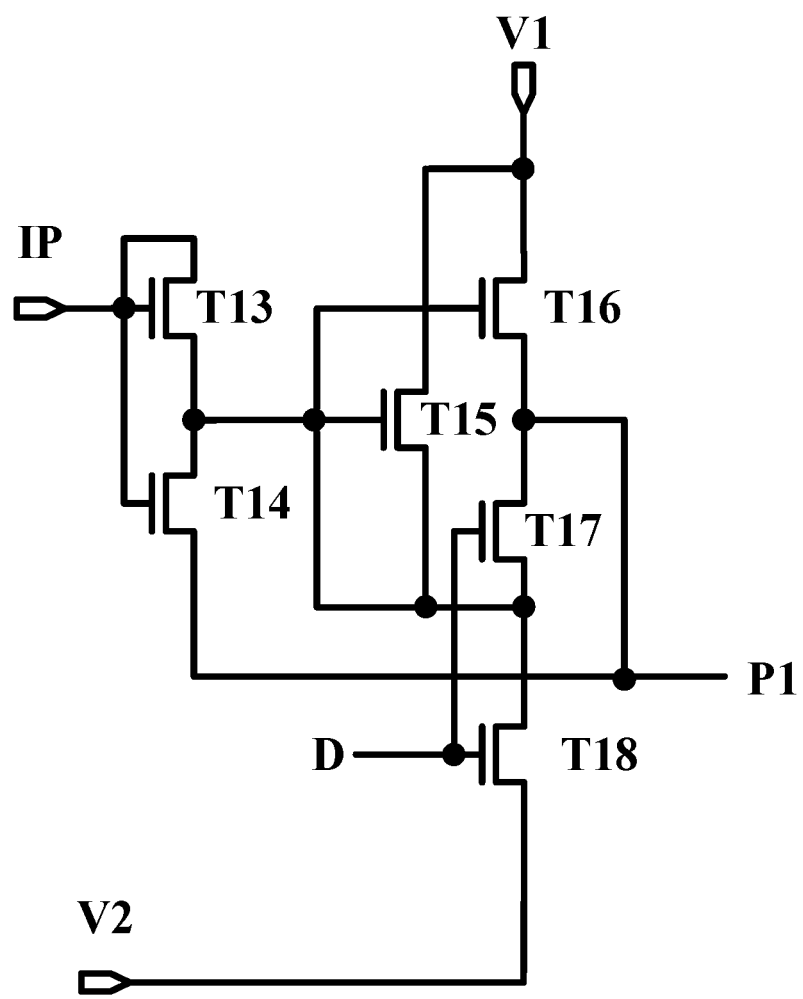
FIG. 4 is a schematic view showing a substitutional portion of the circuit in FIG. 2.

As shown in FIG. 4, which is a schematic view showing a substitutional portion of the circuit in FIG. 2, as an option, the input circuit 1 may include a thirteenth transistor T13, a fourteenth transistor T14, a fifteenth transistor T15, a sixteenth transistor T16, a seventeenth transistor T17 and an eighteenth transistor T18. A control electrode and a first electrode of the thirteenth transistor T13 are coupled to the input end IP, and a second electrode of the thirteenth transistor T13 is coupled to a first electrode of the fourteenth transistor T14. A control electrode of the fourteenth transistor T14 is coupled to the input end IP, the first electrode of the fourteenth transistor T14 is further coupled to a control electrode of the fifteenth transistor T15, and a second electrode of the fourteenth transistor T14 is coupled to the first pull-up node P1. The control electrode and a second electrode of the fifteenth transistor T15 are coupled to the second electrode of the thirteenth transistor T13, and a first electrode of the thirteenth transistor T13 is coupled to the first voltage end V1. A control electrode of the sixteenth transistor T16 is coupled to the control electrode of the fifteenth transistor T15, a first electrode of the sixteenth transistor T16 is coupled to the first voltage end V1, and a second electrode of the sixteenth transistor T16 is coupled to the first pull-up node P1. A control electrode of the seventeenth transistor T17 is coupled to the pull-down node D, a first electrode of the seventeenth transistor T17 is coupled to the first pull-up node P1, and a second electrode of the seventeenth transistor T17 is coupled to the second electrode of the fifteenth transistor T15. A control electrode of the eighteenth transistor T18 is coupled to the pull-down node D, a first electrode of the eighteenth transistor T18 is coupled to the second electrode of the seventeenth transistor T17, and a second electrode of the eighteenth transistor T18 is coupled to the second voltage end V2.

In the case that the voltage applied to the pull-down node D is valid, the seventh transistor T17 and the eighteenth transistor T18 may be turned on, so the first pull-up node P1 may be coupled to the second voltage end V2, and the voltage applied to the first pull-up node P1 may be invalid.

In the case that the voltage applied to the pull-down node D is invalid, the seventeenth transistor T17 and the eighteenth transistor T18 may be cut off, so the first pull-up node P1 may be electrically decoupled from the second voltage end V2. At this time, the thirteenth transistor T13, the fourteenth transistor T14, the fifteenth transistor T15 and the sixteenth transistor T16 may be turned on as long as the voltage applied to the input end IP is valid, so the first pull-up node P1 may be coupled to the input end IP and the first voltage end V1, and the voltage applied to the first pull-up node P1 may be valid.

In the case that the input circuit 1 is coupled to the pull-down node D, it is able to apply the voltages to the first pull-up node P1 at a correct timing sequence, thereby to reduce the noise.

In FIGS. 2-4, the shift register unit includes the first output circuit 201 and the second output circuit 202. It should be appreciated that, the shift register unit may be extended in a convenient manner to include more output circuits.

Figure 5:
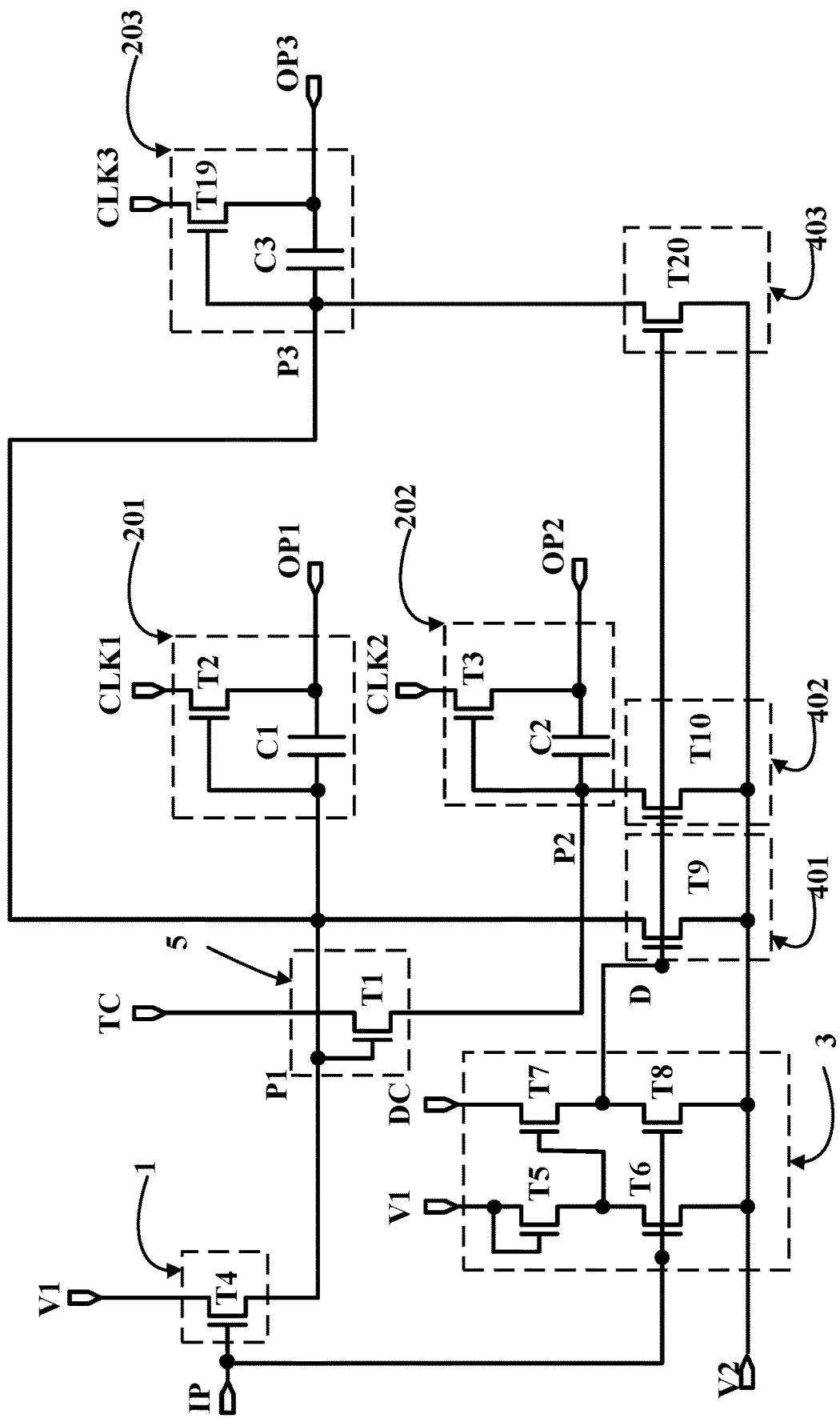
FIG. 5 is another circuit diagram of the shift register unit according to one embodiment of the present disclosure.

As shown in FIG. 5 being another circuit diagram of the shift register unit according to one embodiment of the present disclosure, the shift register unit 100 may further include a third output circuit 202 and a third pull-down circuit 403. A third pull-up node P3 is coupled to the first pull-up node P1. The third output circuit 203 is coupled to the third pull-up node P3, and configured to control a voltage applied to a third output end OP3 based on a voltage applied to the third pull-up node P3. The third pull-down circuit 403 is coupled to the pull-down node D, and configured to control the voltage applied to the third pull-up node P3 based on the voltage applied to the pull-down node D.

Based on a modular design, the third output circuit 203 may be of a structure identical to each of the first output circuit 201 and the second output circuit 202, and the third pull-down circuit 403 may be of a structure identical to each of the first pull-down circuit 401 and the second pull-down circuit 402.

As shown in FIG. 5, the third output circuit 203 includes a nineteenth transistor T19 and a third capacitor C3. A control electrode of the nineteenth transistor T19 is coupled to the third pull-up node P3, a first electrode of the nineteenth transistor T19 is coupled to a third clock signal end CLK3, and a second electrode of the nineteenth transistor T19 is coupled to the third output end OP3. The third capacitor C3 is coupled to the control electrode and the second electrode of the nineteenth transistor T19, i.e., to the third pull-up node P3 and the third output end OP3.

The third pull-down circuit 403 includes a twentieth transistor T20, a control electrode of the twentieth transistor T20 is coupled to the pull-down node D, a first electrode of the twentieth transistor T20 is coupled to the third pull-up node P3, and a second electrode of the twentieth transistor T20 is coupled to the second voltage end V2. In the case that the voltage applied to the pull-down node D is valid, the twentieth transistor T20 may be turned on, so the third pull-up node P3 may be coupled to the second voltage end V2. The voltage applied to the third pull-up node P3 is invalid, so the third output circuit 203 may not output the gate driving signal any more.

It should be appreciated that, the third pull-up node P3 may also be coupled to the second pull-up node P2. The coupling of the third pull-up node P3 to the first pull-up node P1 or the second pull-up node P2 may also be completed by an additional timing controller circuit.

In addition, in the case that the third pull-up node P3 is directly coupled to the first pull-up node P1 or the second pull-up node P2, the third pull-down circuit 403 may not be provided.

Figure 6:
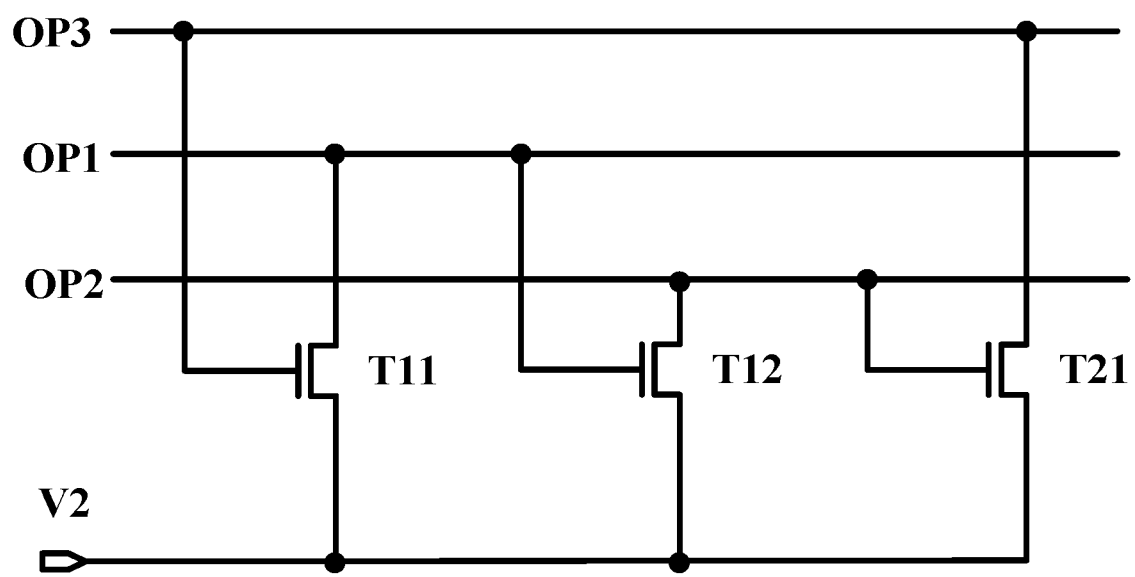
FIG. 6 is a schematic view showing an additional portion of the circuit in FIG. 5.

As shown in FIG. 6 being a schematic view showing an additional portion of the circuit in FIG. 5, the first pull-down circuit 401 further includes the eleventh transistor T11, the second pull-down circuit 402 further includes the twelfth transistor T12, and the third pull-down circuit 403 further includes a twenty-first transistor T21. As compared with the circuit in FIG. 3, the twenty-first transistor T21 is added, and meanwhile a coupling mode of the eleventh transistor T11 of the first pull-down circuit 401 is changed. To be specific, the control electrode of the eleventh transistor T11 may be coupled to the third output end OP3, the first electrode of the eleventh transistor T11 may be coupled to the first output end OP1, and the second electrode of the eleventh transistor T11 may be coupled to the second voltage end V2. In addition, a coupling mode of the twelfth transistor T12 remains unchanged, i.e., the control electrode of the twelfth transistor T12 may be coupled to the first output end OP1, the first electrode of the twelfth transistor T12 may be coupled to the second output end OP2, and the second electrode of the twelfth transistor T12 may be coupled to the second voltage end V2. A control electrode of the twenty-first transistor T21 may be coupled to the second output end OP2, a first electrode of the twelfth transistor T12 may be coupled to the third output end OP3, and a second electrode of the twelfth transistor T12 may be coupled to the second voltage end V2. In this way, in the case that the voltage applied to the first output end OP1 is valid, the voltage applied to the second output end OP2 may be invalid. In the case that the voltage applied to the second output end OP2 is valid, the voltage applied to the third output end OP3 may be invalid. In the case that the voltage applied to the third output end OP3 is valid, the voltage applied to the first output end OP1 may be invalid.

Through the above-mentioned arrangement, it is able to prevent from outputting valid gate driving signals of multiple levels simultaneously, output the gate driving signals of multiple levels at a correct timing sequence, and reduce the noise.

In a possible embodiment of the present disclosure, as compared with FIG. 3, the coupling mode of the eleventh transistor T11 of the first pull-down circuit 401 may remain unchanged. The control electrode of the twenty-first transistor T21 may be coupled to either of the second output end OP2 and the first output end OP1, the first electrode of the twenty-first transistor T21 may be coupled to the third output end OP3, and the second electrode of the twenty-first transistor T21 may be coupled to the second voltage end V2.

In the embodiments of the present disclosure, a control electrode of a transistor may refer to a gate electrode of the transistor, and a first electrode of the transistor may refer to one of a source electrode and a drain electrode of the transistor, and a second electrode of the transistor may refer to the other one of the source electrode and the drain electrode of the transistor.

Figure 7:
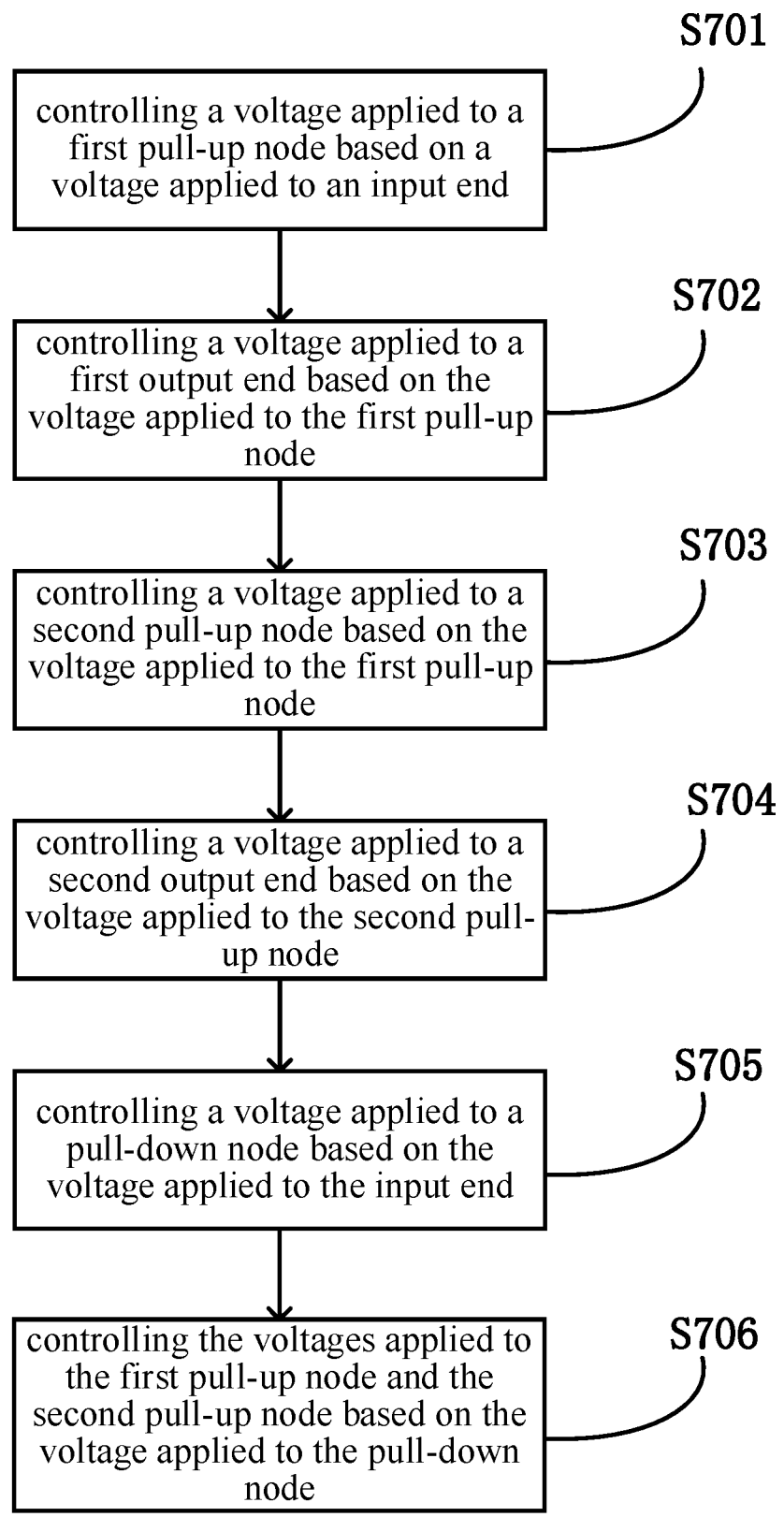
FIG. 7 is a flow chart of a method for driving the shift register unit according to one embodiment of the present disclosure.

The present disclosure further provides in some embodiments a method for driving a shift register unit which, as shown in FIG. 7, includes: S701 of controlling a voltage applied to a first pull-up node based on a voltage applied to an input end; S702 of controlling a voltage applied to a first output end based on the voltage applied to the first pull-up node; S703 of controlling a voltage applied to a second pull-up node based on the voltage applied to the first pull-up node; S704 of controlling a voltage applied to a second output end based on the voltage applied to the second pull-up node; S705 of controlling a voltage applied to a pull-down node based on the voltage applied to the input end; and S706 of controlling the voltages applied to the first pull-up node and the second pull-up node based on the voltage applied to the pull-down node.

Figure 8:
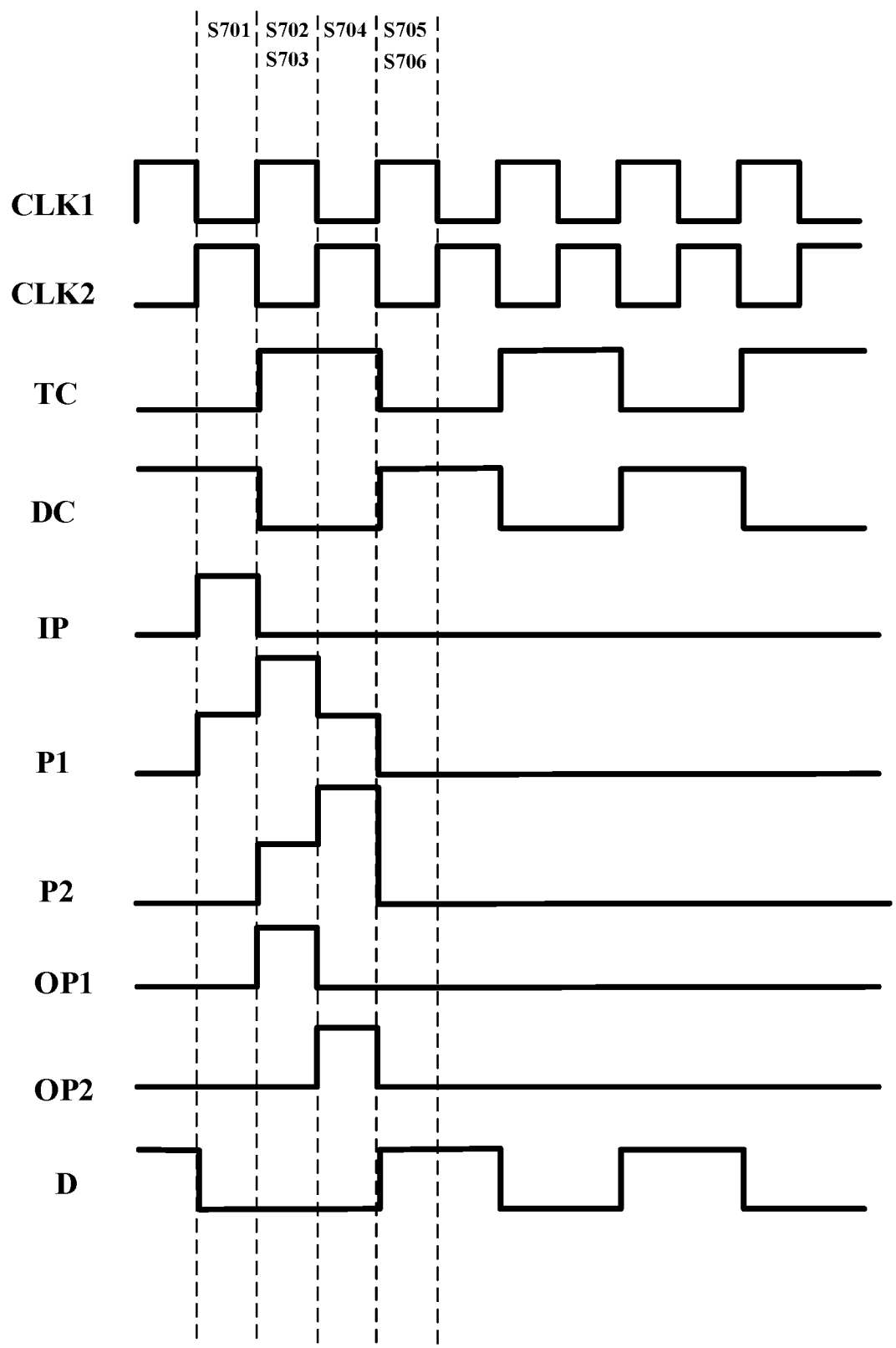
FIG. 8 is a sequence diagram of the driving method in FIG. 7.

FIG. 8 is a timing-sequence diagram of the driving method in FIG. 7. The steps of the driving method in FIG. 7 will be described hereinafter in conjunction with the circuit in FIG. 2 and the timing-sequence diagram in FIG. 8.

In S701, in response to the valid voltage applied to the input end IP, the fourth transistor T4 is turned on, so the first pull-up node P1 is coupled to the first voltage end V1, and the valid voltage is applied to the first pull-up node P1.

In S702, in response to the valid voltage applied to the first pull-up node P1, the second transistor T2 is turned on, so the first output end OP1 is coupled to the first clock signal end CLK1. At this time, the valid voltage is applied to the first clock signal end CLK1, so the first output end OP1 outputs a valid gate driving signal.

Meanwhile, in the case that the voltage applied to the first output end OP1 is changed from being invalid to be valid, the voltage applied to the first pull-up node P1 may change too due to a constant voltage difference between the two ends of the first capacitor C1. In the case that the valid voltage applied to the first pull-up node P1 is a high voltage, the voltage applied to the first pull-up node P1 may increase continuously, so as to maintain the second transistor T2 in the on state in a more stable manner.

In S703, in response to the valid voltage applied to the first pull-up node P1, the first transistor T1 is turned on, so the timing control signal end TC is coupled to the second pull-up node P2. At this time, the voltage applied to the second pull-up node P2 is valid due to the voltage applied to the timing control signal end TC.

In S704, in response to the valid voltage applied to the second pull-up node P2, the third transistor T3 is turned on, so the second output end OP2 is coupled to the second clock signal end CLK2. The voltage applied to the second clock signal end CLK2 is valid, so the second output end OP2 outputs the valid gate driving signal. Meanwhile, in the case that the voltage applied to the second output end OP2 is changed from being invalid to be valid, the voltage applied to the second pull-up node P2 may change too due to the constant voltage difference between the two ends of the second capacitor C2. In the case that the valid voltage applied to the second pull-up node P2 is a high voltage, the voltage applied to the second pull-up node P2 may increase continuously, so as to enable the third transistor T3 to be in the on state in a more stable manner.

In S705, in response to the invalid voltage applied to the input end IP, the sixth transistor T6 and the eighth transistor T8 are cut off. Under the effect of the valid voltage applied to the first voltage end V1, the fifth transistor T5 is in the on state all the time. In the case that the valid voltage is applied to the second electrode of the fifth transistor T5, the seventh transistor T7 is turned on, so the pull-down node D is coupled to the pull-down control signal end DC. The voltage applied to the pull-down control signal end DC is valid, so the voltage applied to the pull-down node D is valid too.

In S706, the valid voltage is applied to the pull-down node D, so the ninth transistor T9 is turned on, and the first pull-up node P1 is coupled to the second voltage end V2. The voltage applied to the first pull-up node P1 is invalid. In the case that the voltage applied to the pull-down node D is valid, the tenth transistor T10 is turned on, and the second pull-up node P2 is coupled to the second voltage end V2. At this time, the voltage applied to the second pull-up node P2 is invalid.

In addition, it should be appreciated that, for ease of description, FIG. 7 shows the steps for the driving method sequentially, but it shall not be used to define the order of the steps. For example, S705 and S706 may be performed simultaneously. In addition, the order of the steps may be adjusted.

Figure 9:
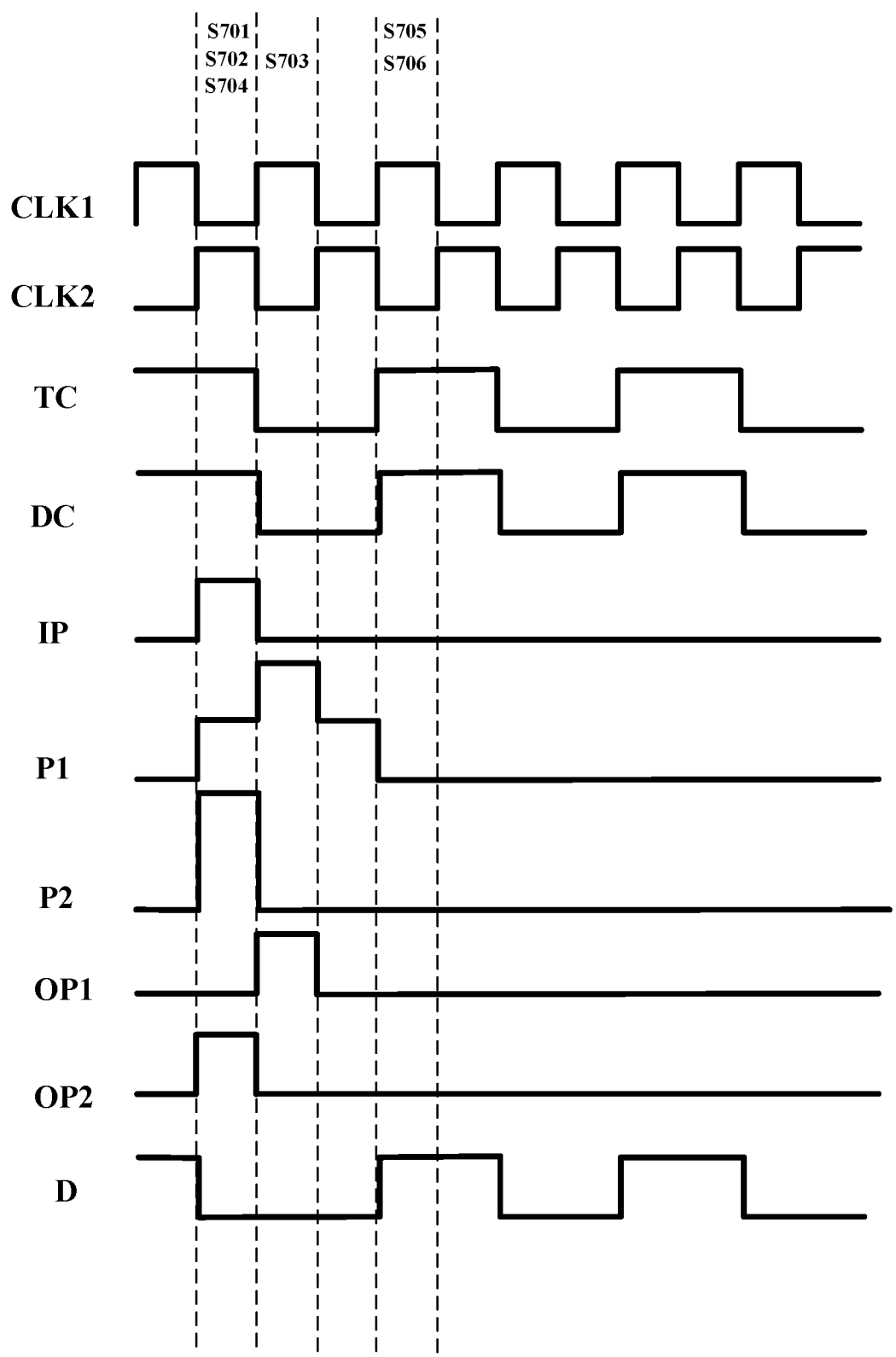
FIG. 9 is another sequence diagram of the driving method in FIG. 7.

FIG. 9 is another timing sequence diagram of the driving method in FIG. 7. Different from FIG. 8, in FIG. 9 a waveform of the voltage applied to the timing control end TC is changed, i.e., a time point when the voltage applied to the timing control end TC is changed to be valid is advanced. Correspondingly, a time point when the voltage applied to the second pull-up node P2 is valid is advanced too, and the second output end OP2 may output the gate driving signal before the first output end OP1.

Based on the above sequence, the signal outputted from the second output end OP2 is identical to the signal applied to the input end IP. Hence, the signal outputted from the second output OP2 may be fed back to a previous-level shift register unit, so as to enhance a signal driving capability.

Based on FIGS. 8 and 9, it is able to flexibly adjust the timing sequence relationship among the outputs of multiple levels merely by changing the voltage applied to the timing control end TC. One of the driving signals outputted from a current-level shift register unit may be used to replace the driving signal outputted from a previous-level or a next-level shift register unit, so as to facilitate the maintenance of the defective shift register unit.

Figure 10:
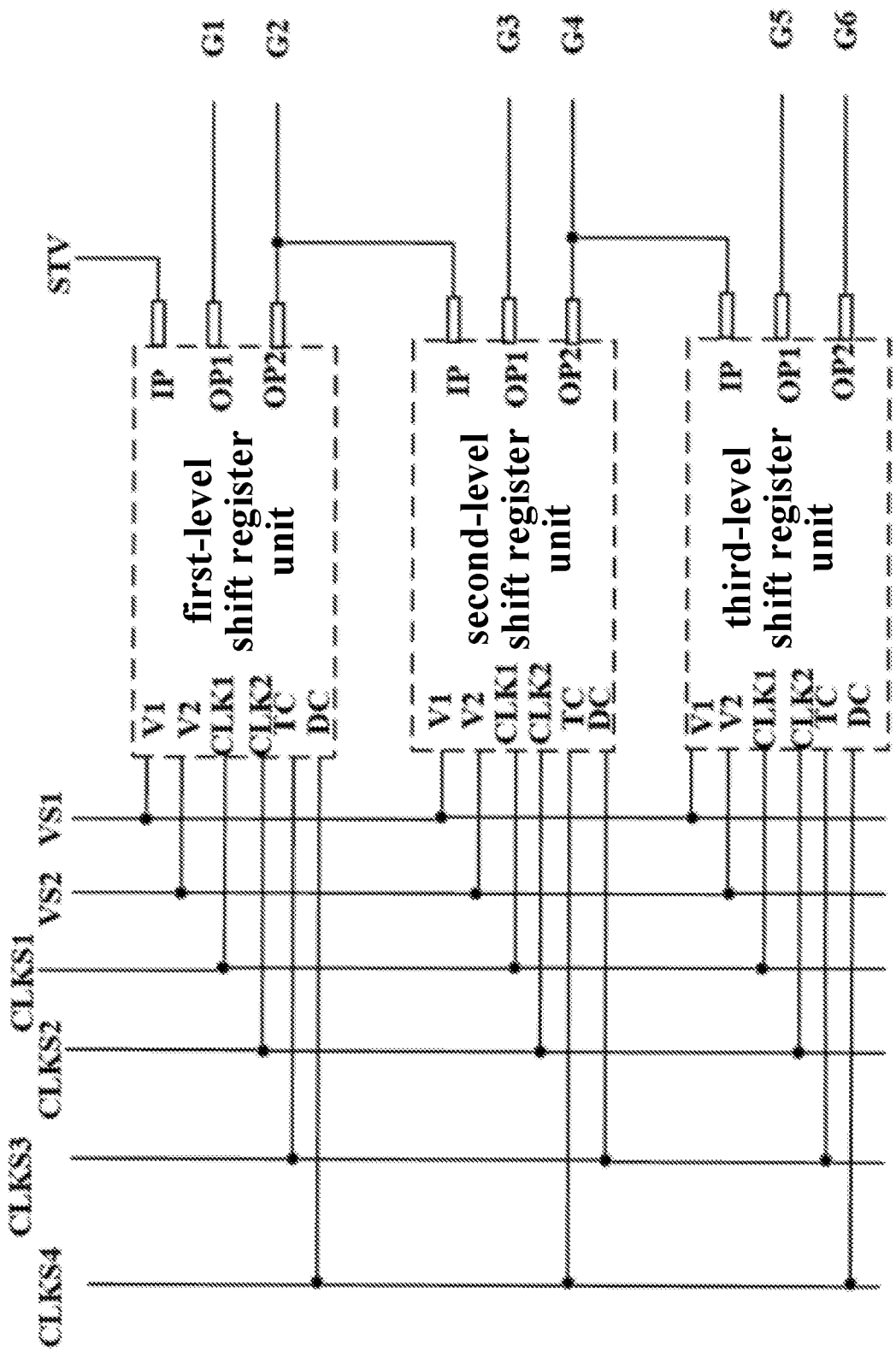
FIG. 10 is a block diagram of a gate driving circuit according to one embodiment of the present disclosure.

The present disclosure further provides in some embodiments a gate driving circuit which, as shown in FIG. 10, includes a plurality of the above-mentioned shift register units connected to each other in a cascaded manner. FIG. 10 merely shows three levels of the shift register units. Apart from a last-level shift register unit, one of output ends of a current-level shift register unit is coupled to an input end of a next-level shift register unit next to the current-level shift register unit. For example, in FIG. 10, the second output OP2 of the current-level shift register unit is coupled to the input end IP of the next-level shift register unit next to the current-level shift register unit.

The input end IP of a first-level shift register unit of the gate driving circuit is coupled to a scanning start end STV. The first-level shift register unit is coupled to a gate line G1 corresponding to pixel units in a first row and a gate line G2 corresponding to pixel units in a second row. A second-level shift register unit is coupled to a gate line G3 corresponding to pixel units in a third row and a gate line G4 corresponding to pixel units in a fourth row. A third-level shift register unit is coupled to a gate line G5 corresponding to pixel units in a fifth row and a gate line G6 corresponding to pixel units in a sixth row. The first clock signal end CLK1 of each shift register unit is coupled to a first clock signal source CLKS1, the second clock signal end CLK2 is coupled to a second clock signal source CLKS2. In addition, in order to provide an identical driving timing sequence for each of the shift register units, the timing control signal end TC of each shift register unit in an odd-numbered level is coupled to a third clock signal source CLKS3, and the pull-down control signal end DC of each shift register unit in an odd-numbered level is coupled to a fourth clock signal source CLKS4. In contrast, the timing control signal end TC of each shift register unit in an even-numbered level is coupled to the fourth clock signal source CLKS4, and the pull-down control signal end DC of each shift register unit in an even-numbered level is coupled to the third clock signal source CLKS3.

The first clock signal source CLKS1 is capable of providing a clock signal having a wave form identical to, and a phase different by 180° from, the second clock signal source CLKS2. The third clock signal source CLKS3 is capable of providing a clock signal having a wave form identical to, and a phase different by 180° from, the fourth clock signal source CLKS4. In addition, the clock signal from each of the third clock signal source CLKS3 and the fourth clock signal source CLKS4 has a period double that from each of the first clock signal source CLKS1 and the second clock signal source CLKS2. It should be appreciated that, the multiple is associated with the number of the output circuits. For example, in the case of three output circuits, the multiple may be 3.

Figure 11:
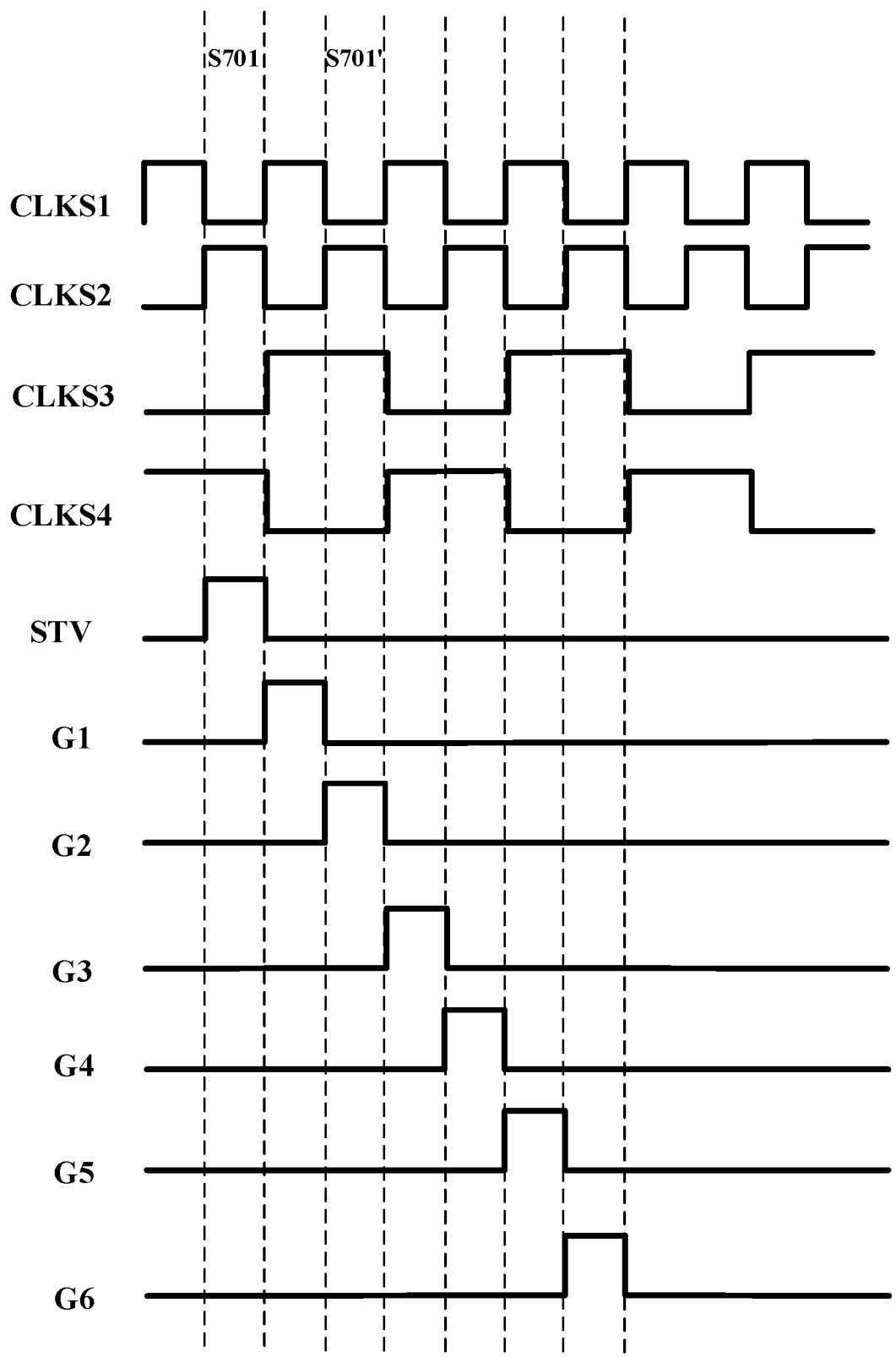
FIG. 11 is a sequence diagram of the gate driving circuit in FIG. 10.

As shown in FIG. 11 being a sequence diagram of the gate driving circuit in FIG. 10, for the first-level shift register unit, in step S701, a low-level voltage from the first clock signal source CLKS1 is applied to the first clock signal end CLK1, a high-level voltage from the second clock signal source CLKS2 is applied to the second clock signal end CLK2, a low-level voltage from the third clock signal source CLKS3 is applied to the timing control signal end TC, a high-level voltage from the fourth clock signal source CLKS4 is applied to the pull-down control signal end DC, and a high-level voltage from the scanning start end STV is applied to the input end IP.

For the second-level shift register unit, in step S701', a low-level voltage from the first clock signal source CLKS1 is applied to the first clock signal end CLK1, a high-level voltage from the second clock signal source CLKS2 is applied to the second clock signal end CLK2, a low-level voltage from the fourth clock signal source CLKS4 is applied to the timing control signal end TC, a high-level voltage from the third clock signal source CLKS3 is applied to the pull-down control signal end DC, and a high-level voltage from the gate line corresponding to the pixel units in the second row is applied to the input end IP.

As a result, for the second-level shift register unit, the coupling modes of the timing control signal end TC and the pull-down control signal end DC are different from the coupling modes of the first-level shift register unit, so a driving timing sequence of the second-level shift register unit may be identical to a driving timing sequence of the first-level shift register unit.

According to the embodiments of the present disclosure, it is able for one level of shift register unit to output gate driving signals of multiple levels. In addition, it is able to adjust the timing sequence relationship among the gate driving signals of multiple levels, so as to meet different application requirements. Further, each shift register unit of the gate driving circuit is driven by the identical clock signal sources, so it is able to reduce the requirements on the signal sources merely by simply adjusting the coupling modes of the two adjacent levels of the shift register units to the clock signal sources.

Figure 12:
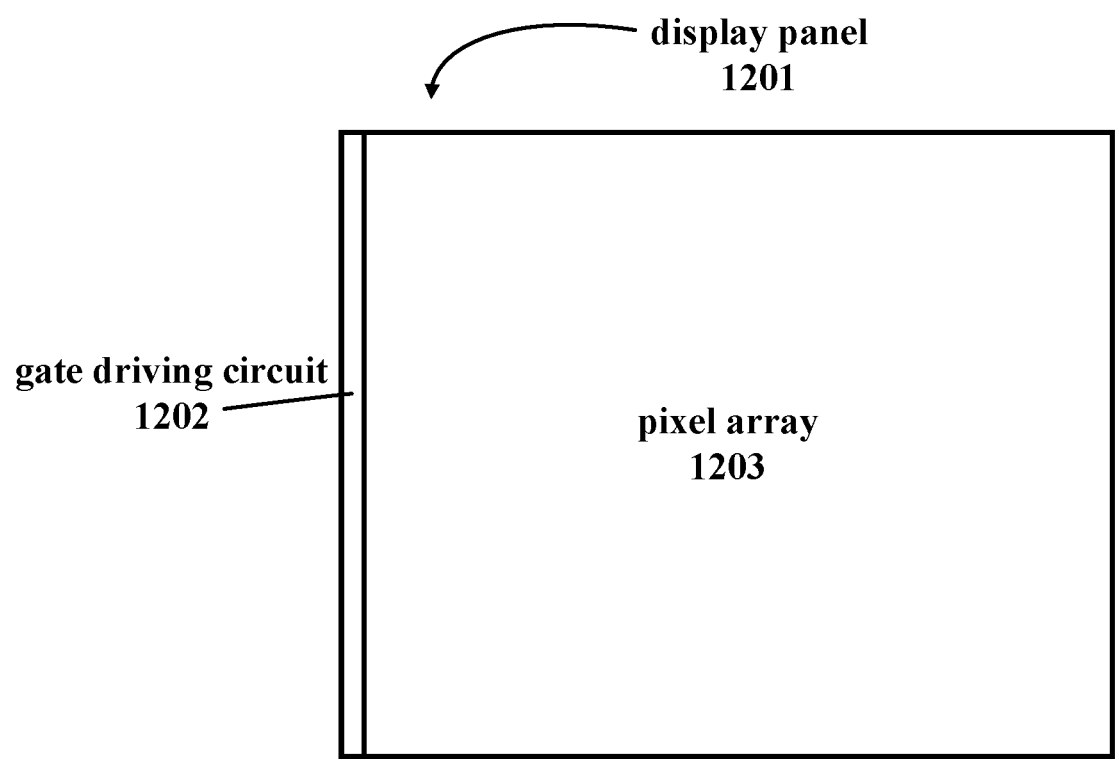
FIG. 12 is a block diagram of a display panel according to one embodiment of the present disclosure.

The present disclosure further provides in some embodiments a display panel 1201 which, as shown in FIG. 12, includes the above-mentioned gate driving circuit 1202 and a pixel array 1203. The gate driving circuit 1202 is configured to scan and drive pixel units in the pixel array 1203. According to the display device 1201 in the embodiments of the present disclosure, it is able for one level of shift register unit to output gate driving signals of multiple levels. In addition, through adjusting the timing sequence relationship among the gate driving signals of multiple levels, it is able to meet different application requirements.

The display panel 1201 may be applied to any device having a display function, e.g., a mobile phone, a television, a digital photo frame, a navigator or a display.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A shift register unit, comprising an input circuit, a timing controller circuit, a first output circuit, a second output circuit, a pull-down control circuit, a first pull-down circuit and a second pull-down circuit; wherein
the input circuit is coupled to a first pull-up node, and configured to control a voltage applied to the first pull-up node based on a voltage applied to an input end;
the timing controller circuit is coupled to the first pull-up node and a second pull-up node, and configured to control a voltage applied to the second pull-up node based on the voltage applied to the first pull-up node;
the first output circuit is coupled to the first pull-up node, and configured to control a voltage applied to a first output end based on the voltage applied to the first pull-up node;

the second output circuit is coupled to the second pull-up node, and configured to control a voltage applied to a second output end based on the voltage applied to the second pull-up node;

the pull-down control circuit is coupled to the first pull-down circuit and the second pull-down circuit via a pull-down node, and configured to control a voltage applied to the pull-down node based on the voltage applied to the input end;

the first pull-down circuit is coupled to the first pull-up node, and configured to control the voltage applied to the first pull-up node based on the voltage applied to the pull-down node; and the second pull-down circuit is coupled to the second pull-up node, and configured to control the voltage applied to the second pull-up node based on the voltage applied to the pull-down node.

2. The shift register unit according to claim 1, further comprising:

a third output circuit coupled to a third pull-up node, and configured to control a voltage applied to a third output end based on a voltage applied to the third pull-up node, wherein the third pull-up node is coupled to one of the first pull-up node and the second pull-up node.

3. The shift register unit according to claim 1, wherein the timing controller circuit comprises a first transistor, a control electrode of the first transistor is coupled to the first pull-up node, a first electrode of the first transistor is coupled to a timing control signal end, and a second electrode of the first transistor is coupled to the second pull-up node.

4. The shift register unit according to claim 1, wherein the first output circuit comprises a second transistor and a first capacitor;

a control electrode of the second transistor is coupled to the first pull-up node, a first electrode of the second transistor is coupled to a first clock signal end, and a second electrode of the second transistor is coupled to the first output end;

the first capacitor is coupled to the control electrode and the second electrode of the second transistor;

the second output circuit comprises a third transistor and a second capacitor;

a control electrode of the third transistor is coupled to the second pull-up node, a first electrode of the third transistor is coupled to a second clock signal end, and a second electrode of the third transistor is coupled to the second output end; and the second capacitor is coupled to the control electrode and the second electrode of the third transistor.

5. The shift register unit according to claim 1, wherein the input circuit comprises a fourth transistor, a control electrode of the fourth transistor is coupled to the input end, a first electrode of the fourth transistor is coupled to a first voltage end, and a second electrode of the fourth transistor is coupled to the first pull-up node.

6. The shift register unit according to claim 1, wherein the pull-down control circuit comprises a fifth transistor, a sixth transistor, a seventh transistor and an eighth transistor;

a control electrode and a first electrode of the fifth transistor are coupled to a first voltage end, and a second electrode of the fifth transistor is coupled to a first electrode of the sixth transistor;

a control electrode of the sixth transistor is coupled to the input end, the first electrode of the sixth transistor is further coupled to a control electrode of the seventh transistor, and a second electrode of the sixth transistor is coupled to a second voltage end;

the control electrode of the seventh transistor is further coupled to the second electrode of the fifth transistor, a first electrode of the seventh transistor is coupled to a pull-down control signal end, and a second electrode of the seventh transistor is coupled to a first electrode of the eighth transistor; and a control electrode of the eighth transistor is coupled to the input end, the first electrode of the eighth transistor is further coupled to the pull-down node, and a second electrode of the eighth transistor is coupled to the second voltage end.

7. The shift register unit according to claim 1, wherein the first pull-down circuit comprises a ninth transistor, a control electrode of the ninth transistor is coupled to the pull-down node, a first electrode of the ninth transistor is coupled to the first pull-up node, and a second electrode of the ninth transistor is coupled to a second voltage end; and the second pull-down circuit comprises a tenth transistor, a control electrode of the tenth transistor is coupled to the pull-down node, a first electrode of the tenth transistor is coupled to the second pull-up node, and a second electrode of the tenth transistor is coupled to the second voltage end.

8. The shift register unit according to claim 7, wherein the first pull-down circuit further comprises an eleventh transistor, a first electrode of the eleventh transistor is coupled to the first output end, a second electrode of the eleventh transistor is coupled to the second voltage end, and a control electrode of the eleventh transistor is coupled to the second output end; and the second pull-down circuit further comprises a twelfth transistor, a first electrode of the twelfth transistor is coupled to the second output end, a second electrode of the twelfth transistor is coupled to the second voltage end, and a control electrode of the twelfth transistor is coupled to the first output end.

9. The shift register unit according to claim 1, wherein the input circuit comprises a thirteenth transistor, a fourteenth transistor, a fifteenth transistor, a sixteenth transistor, a seventeenth transistor and an eighteenth transistor;

a control electrode and a first electrode of the thirteenth transistor are coupled to the input end, and a second electrode of the thirteenth transistor is coupled to a first electrode of the fourteenth transistor;

a control electrode of the fourteenth transistor is coupled to the input end, the first electrode of the fourteenth transistor is further coupled to a control electrode of the fifteenth transistor, and a second electrode of the fourteenth transistor is coupled to the first pull-up node;

the control electrode and a second electrode of the fifteenth transistor are coupled to the second electrode of the thirteenth transistor, and a first electrode of the fifteenth transistor is coupled to a first voltage end;

a control electrode of the sixteenth transistor is coupled to the control electrode of the fifteenth transistor, a first electrode of the sixteenth transistor is coupled to the first voltage end, and a second electrode of the sixteenth transistor is coupled to the first pull-up node;

a control electrode of the seventeenth transistor is coupled to the pull-down node, a first electrode of the seventeenth transistor is coupled to the first pull-up node, and a second electrode of the seventeenth transistor is coupled to the second electrode of the fifteenth transistor; and a control electrode of the eighteenth transistor is coupled to the pull-down node, a first electrode of the eighteenth transistor is coupled to the second electrode of the seventeenth transistor, and a second electrode of the eighteenth transistor is coupled to a second voltage end.

10. A method for driving the shift register unit according to claim 1, comprising:

in response to a valid voltage applied to the input end, applying a valid voltage to the first pull-up node;

in response to the valid voltage applied to the first pull-up node and the valid voltage applied to a first clock signal end, applying a valid voltage to the first output end;

in response to the valid voltage applied to the first pull-up node and a valid voltage applied to a timing control signal end, applying a valid voltage to the second pull-up node;

in response to the valid voltage applied to the second pull-up node and a valid voltage applied to a second clock signal end, applying a valid voltage to the second output end;

in response to an invalid voltage applied to the input end and a valid voltage applied to a pull-down control signal end, applying a valid voltage to the pull-down node; and in response to the valid voltage applied to the pull-down node, applying an invalid voltage to the first pull-up node and the second pull-up node.

11. A gate driving circuit, comprising a plurality of the shift register units each according to claim 1, wherein the shift register units are connected to each other in a cascaded manner, and one of output ends of a current-level shift register unit is coupled to an input end of a next-level shift register unit that is next to the current-level shift register unit.

12. The gate driving circuit according to claim 11, wherein the shift register unit further comprises:

a third output circuit coupled to a third pull-up node, and configured to control a voltage applied to a third output end based on a voltage applied to the third pull-up node, wherein the third pull-up node is coupled to one of the first pull-up node and the second pull-up node.

13. The gate driving circuit according to claim 11, wherein the timing controller circuit comprises a first transistor, a control electrode of the first transistor is coupled to the first pull-up node, a first electrode of the first transistor is coupled to a timing control signal end, and a second electrode of the first transistor is coupled to the second pull-up node.

14. The gate driving circuit according to claim 11, wherein the first output circuit comprises a second transistor and a first capacitor;

a control electrode of the second transistor is coupled to the first pull-up node, a first electrode of the second transistor is coupled to a first clock signal end, and a second electrode of the second transistor is coupled to the first output end;

the first capacitor is coupled to the control electrode and the second electrode of the second transistor;

the second output circuit comprises a third transistor and a second capacitor;

a control electrode of the third transistor is coupled to the second pull-up node, a first electrode of the third transistor is coupled to a second clock signal end, and a second electrode of the third transistor is coupled to the second output end; and the second capacitor is coupled to the control electrode and the second electrode of the third transistor.

15. The gate driving circuit according to claim 11, wherein the input circuit comprises a fourth transistor, a control electrode of the fourth transistor is coupled to the input end, a first electrode of the fourth transistor is coupled to a first voltage end, and a second electrode of the fourth transistor is coupled to the first pull-up node.

16. A display panel, comprising the gate driving circuit according to claim 11.

17. A display device, comprising the display panel according to claim 16.

18. A shift register unit, comprising a first transistor, a second transistor, a first capacitor, a third transistor, a second capacitor, a fourth transistor, a fifth transistor, a sixth transistor, a seventh transistor, an eighth transistor, a ninth transistor, a tenth transistor, an input end, a first output end and a second output end;

a control electrode of the first transistor is coupled to a first pull-up node, a first electrode of the first transistor is coupled to a timing control signal end, and a second electrode of the first transistor is coupled to a second pull-up node;

a control electrode of the second transistor is coupled to the first pull-up node, a first electrode of the second transistor is coupled to a first clock signal end, and a second electrode of the second transistor is coupled to the first output end;

the first capacitor is coupled to the control electrode and the second electrode of the second transistor;

a control electrode of the third transistor is coupled to the second pull-up node, a first electrode of the third transistor is coupled to a second clock signal end, and a second electrode of the third transistor is coupled to the second output end;

the second capacitor is coupled to the control electrode and the second electrode of the third transistor;

a control electrode of the fourth transistor is coupled to the input end, a first electrode of the fourth transistor is coupled to a first voltage end, and a second electrode of the fourth transistor is coupled to the first pull-up node;

a control electrode and a first electrode of the fifth transistor are coupled to the first voltage end, and a second electrode of the fifth transistor is coupled to a first electrode of the sixth transistor;

a control electrode of the sixth transistor is coupled to the input end, the first electrode of the sixth transistor is further coupled to a control electrode of the seventh transistor, and a second electrode of the sixth transistor is coupled to a second voltage end;

the control electrode of the seventh transistor is further coupled to the second electrode of the fifth transistor, a first electrode of the seventh transistor is coupled to a pull-down control signal end, and a second electrode of the seventh transistor is coupled to a first electrode of the eighth transistor;

a control electrode of the eighth transistor is coupled to the input end, the first electrode of the eighth transistor is further coupled to a pull-down node, and a second electrode of the eighth transistor is coupled to the second voltage end;

a control electrode of the ninth transistor is coupled to the pull-down node, a first electrode of the ninth transistor is coupled to the first pull-up node, and a second electrode of the ninth transistor is coupled to the second voltage end; and a control electrode of the tenth transistor is coupled to the pull-down node, a first electrode of the tenth transistor is coupled to the second pull-up node, and a second electrode of the tenth transistor is coupled to the second voltage end.

19. The shift register unit according to claim 18, further comprising an eleventh transistor and a twelfth transistor,
wherein a first electrode of the eleventh transistor is coupled to the first output end, a second electrode of the eleventh transistor is coupled to the second voltage end, and a control electrode of the eleventh transistor is coupled to the second output end; and a first electrode of the twelfth transistor is coupled to the second output end, a second electrode the twelfth transistor is coupled to the second voltage end, and a control electrode of the twelfth transistor is coupled to the first output end.

20. A shift register unit, comprising a first transistor, a second transistor, a first capacitor, a third transistor, a second capacitor, a fifth transistor, a sixth transistor, a seventh transistor, an eighth transistor, a ninth transistor, a tenth transistor, a thirteenth transistor, a fourteenth transistor, a fifteenth transistor, a sixteenth transistor, a seventeenth transistor, an eighteenth transistor, an input end, a first output end and a second output end;

a control electrode of the first transistor is coupled to a first pull-up node, a first electrode of the first transistor is coupled to a timing control signal end, and a second electrode of the first transistor is coupled to a second pull-up node;

a control electrode of the second transistor is coupled to the first pull-up node, a first electrode of the second transistor is coupled to a first clock signal end, and a second electrode of the second transistor is coupled to the first output end;

the first capacitor is coupled to the control electrode and the second electrode of the second transistor;

a control electrode of the third transistor is coupled to the second pull-up node, a first electrode of the third transistor is coupled to a second clock signal end, and a second electrode of the third transistor is coupled to the second output end;

the second capacitor is coupled to the control electrode and the second electrode of the third transistor;

a control electrode and a first electrode of the fifth transistor are coupled to a first voltage end, and a second electrode of the fifth transistor is coupled to a first electrode of the sixth transistor;

a control electrode of the sixth transistor is coupled to the input end, the first electrode of the sixth transistor is further coupled to a control electrode of the seventh transistor, and a second electrode of the sixth transistor is coupled to a second voltage end;

the control electrode of the seventh transistor is further coupled to the second electrode of the fifth transistor, a first electrode of the fifth transistor is coupled to a pull-down control signal end, and a second electrode of the fifth transistor is coupled to a first electrode of the eighth transistor;

a control electrode of the eighth transistor is coupled to the input end, the first electrode of the eighth transistor is further coupled to a pull-down node, and a second electrode of the eighth transistor is coupled to the second voltage end;

a control electrode of the ninth transistor is coupled to the pull-down node, a first electrode of the ninth transistor is coupled to the first pull-up node, and a second electrode of the ninth transistor is coupled to the second voltage end;

a control electrode of the tenth transistor is coupled to the pull-down node, a first electrode of the tenth transistor is coupled to the second pull-up node, and a second electrode of the tenth transistor is coupled to the second voltage end;

a control electrode and a first electrode of the thirteenth transistor are coupled to the input end, and a second electrode of the thirteenth transistor is coupled to a first electrode of the fourteenth transistor;

a control electrode of the fourteenth transistor is coupled to the input end, a first electrode of the fourteenth transistor is coupled to a control electrode of the fifteenth transistor, and a second electrode of the fourteenth transistor is coupled to the first pull-up node;

the control electrode and a second electrode of the fifteenth transistor are coupled to the second electrode of the thirteenth transistor, and a first electrode of the fifteenth transistor is coupled to the first voltage end;

a control electrode of the sixteenth transistor is coupled to the control electrode of the fifteenth transistor, a first electrode of the sixteenth transistor is coupled to the first voltage end, and a second electrode of the sixteenth transistor is coupled to the first pull-up node;

a control electrode of the seventeenth transistor is coupled to the pull-down node, a first electrode of the seventeenth transistor is coupled to the first pull-up node, and a second electrode of the seventeenth transistor is coupled to the second electrode of the fifteenth transistor; and a control electrode of the eighteenth transistor is coupled to the pull-down node, a first electrode of the eighteenth transistor is coupled to the second electrode of the seventeenth transistor, and a second electrode of the eighteenth transistor is coupled to the second voltage end.

* * * * *